(12) United States Patent
Lin et al.

(10) Patent No.: US 8,263,495 B2
(45) Date of Patent: Sep. 11, 2012

(54) RELEASE ACCUMULATIVE CHARGES BY TUNING ESC VOLTAGES IN VIA-ETCHERS

(75) Inventors: Ting-Yi Lin, Hsin-Chu (TW); Chi-Yuan Wen, Tainan (TW); Chuang Tse Chuan, Tainan (TW); Miau-Shing Tsay, Tainan (TW); Ming Li Wu, Tainan (TW)

(73) Assignee: Global Unichip Corp., Hsin-Chu (TW)

( * ) Notice: Subject to any disclaimer, the term of this patent is extended or adjusted under 35 U.S.C. 154(b) by 335 days.

(21) Appl. No.: 12/642,745

(22) Filed: Dec. 18, 2009

(65) Prior Publication Data

US 2011/0151669 A1 Jun. 23, 2011

(51) Int. Cl.
*H01L 21/302* (2006.01)
*H01L 21/461* (2006.01)
(52) U.S. Cl. ........ 438/689; 438/700; 438/706; 438/707; 438/710; 438/714
(58) Field of Classification Search .................. None
See application file for complete search history.

(56) References Cited

U.S. PATENT DOCUMENTS

| | | | |
|---|---|---|---|
| 5,916,689 A | 6/1999 | Collins et al. | |
| 6,318,384 B1 * | 11/2001 | Khan et al. | 134/22.1 |
| 6,452,775 B1 * | 9/2002 | Nakajima | 361/234 |
| 6,686,254 B2 | 2/2004 | Petrucci et al. | |
| 6,764,940 B1 * | 7/2004 | Rozbicki et al. | 438/627 |
| 6,862,723 B1 | 3/2005 | Wang et al. | |
| 7,813,103 B2 * | 10/2010 | Shannon et al. | 361/234 |

* cited by examiner

*Primary Examiner* — Duy Deo
(74) *Attorney, Agent, or Firm* — Slater & Matsil, L.L.P.

(57) ABSTRACT

A method of forming an integrated circuit structure on a wafer includes providing a first etcher comprising a first electrostatic chuck (ESC); placing the wafer on the first ESC; and forming a via opening in the wafer using the first etcher. After the step of forming the via opening, a first reverse de-chuck voltage is applied to the first ESC to release the wafer. The method further includes placing the wafer on a second ESC of a second etcher; and performing an etching step to form an additional opening in the wafer using the second etcher. After the step of forming the additional opening, a second reverse de-chuck voltage is applied to the second ESC to release the wafer. The second reverse de-chuck voltage is different from the first reverse de-chuck voltage.

14 Claims, 4 Drawing Sheets

RELEASE ACCUMULATIVE CHARGES BY TUNING ESC VOLTAGES IN VIA-ETCHERS

TECHNICAL FIELD

This invention relates generally to integrated circuit manufacturing processes and more particularly to via-etching processes.

BACKGROUND

Integrated circuits typically include a plurality of layers comprising different materials. These layers are formed or deposited using a variety of different processes. These deposited layers are patterned to form final designs and the patterning of the deposited layer includes etching processes.

Since the formation of integrated circuits involves many, sometimes hundreds of process steps, controlling the failure rate in each of the process steps becomes vitally important. When a failure occurs, the failed components need to be identified. Further research is then performed to find the reasons of the failure and to determine how process steps can be adjusted to avoid the failure.

The failures, however, are sometimes subtle, and may only occur to some of the integrated circuits (products), but not to other circuits. The process steps thus need to be customized to solve these product-specific problems. For example, in some of the input/output (IO) chips, it was found that the joint test action group (JTAG) failure rate is particularly high, sometimes as high as about 12 percent to about 18 percent. Solutions to these types of problems are thus needed.

SUMMARY OF THE INVENTION

In accordance with one aspect of the present invention, a method of forming an integrated circuit structure on a wafer includes providing a first etcher including a first electrostatic chuck (ESC); placing the wafer on the first ESC; and forming a via opening in the wafer using the first etcher. After the step of forming the via opening, a first reverse de-chuck voltage is applied to the first ESC to release the wafer. The method further includes placing the wafer on a second ESC of a second etcher; and performing an etching step to form an additional opening in the wafer using the second etcher. After the step of forming the additional opening, a second reverse de-chuck voltage is applied to the second ESC to release the wafer. The second reverse de-chuck voltage is different from the first reverse de-chuck voltage.

In accordance with another aspect of the present invention, a method of forming an integrated circuit structure includes providing an etcher including an ESC; placing a first wafer on the ESC; and forming a first via opening in the first wafer using the etcher. After the step of forming the first via opening, a first reverse de-chuck voltage is applied to the ESC to release the first wafer. The method further includes placing a second wafer on the ESC; and forming a second via opening in the second wafer using the etcher. After the step of forming the second via opening, a second reverse de-chuck voltage is applied to the ESC to release the second wafer. The second reverse de-chuck voltage is different from the first reverse de-chuck voltage.

In accordance with yet another aspect of the present invention, a method of forming an integrated circuit structure on a wafer includes providing an etcher including an ESC; and placing the wafer on the ESC. The wafer includes a conductive feature and a dielectric layer over the conductive feature. The method further includes etching the dielectric layer to form a via opening in the wafer using the etcher until the conductive feature is exposed through the via opening. After the step of forming the via opening, a reverse de-chuck voltage is applied to the ESC to release the wafer. The reverse de-chuck voltage is between about −650V and about −975V.

Advantageously, by using the embodiments of the present invention, the joint test action group (JTAG) failures occurring to some wafers are solved using customized etching processes. In addition, the solutions provided by the embodiments of the present invention do not involve the redesign of integrated circuits.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments of the present invention provide many applicable inventive concepts that can be embodied in a wide variety of specific contexts. The specific embodiments discussed are merely illustrative of specific ways to make and use the invention and do not limit the scope of the invention.

Figure 1:
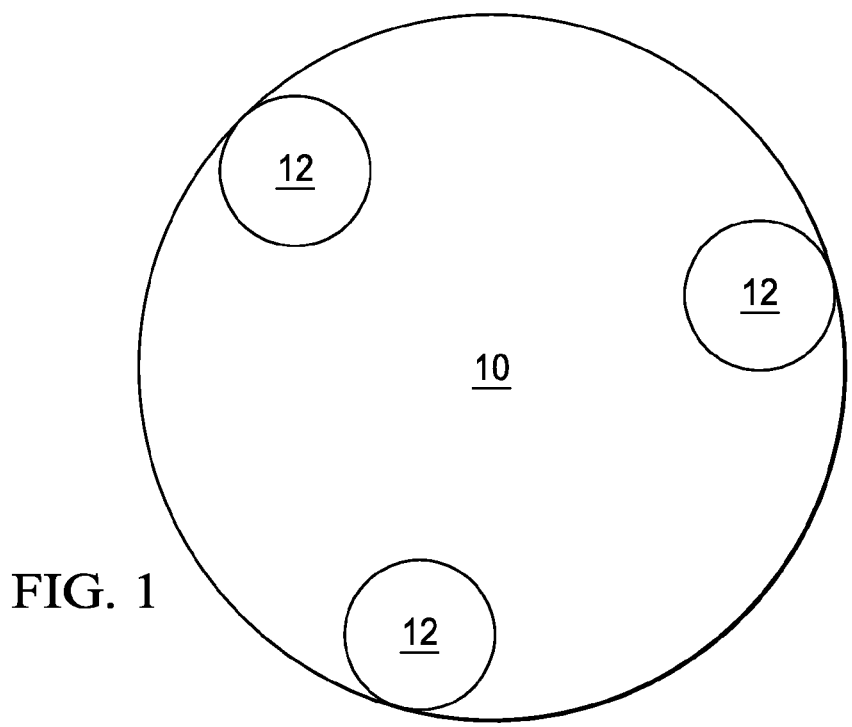
FIG. 1 illustrates a schematic view of a wafer showing the locations of joint test action group (JTAG) failures.

In the manufacturing of an input/output related integrated circuit, it was found that the joint test action group (JTAG) failure rate of the chips in some wafers is unexpectedly high. By pin-pointing the chips having the failures, it was found that the failed chips are mainly at the corners and the center of wafers, particularly at the corners. FIG. 1 schematically illustrates three corners 12 in wafer 10 that are prone to the JTAG failures. Further study for the cause of the failure has revealed that corners 12 were directly over the lift pins of the etchers when via-etching processes were performed to the wafers.

Figure 2:
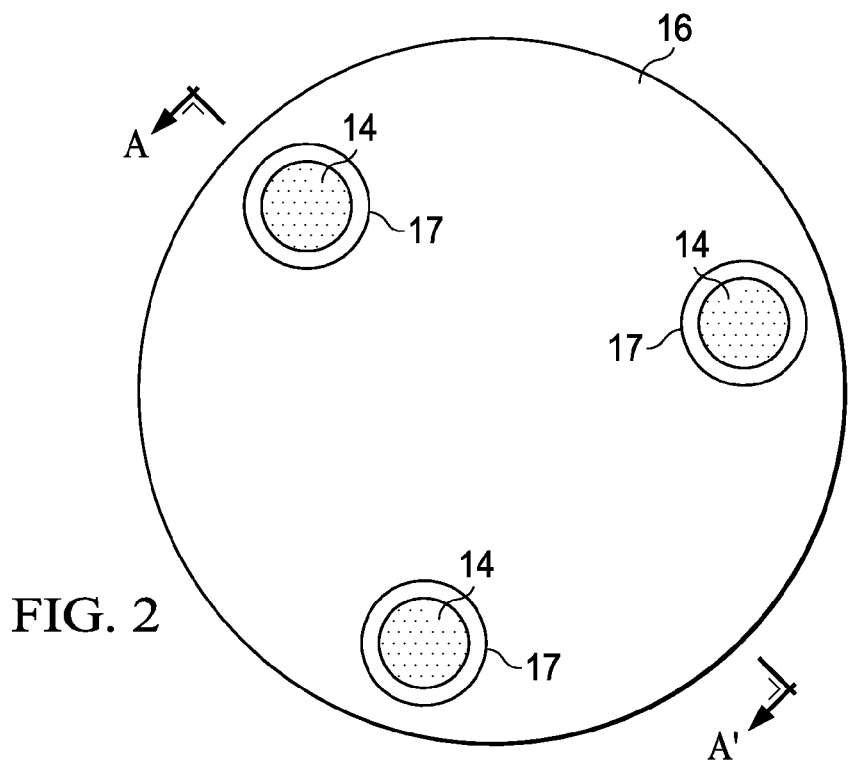
FIG. 2 illustrates a top view of an electrostatic chuck (ESC) and lift pins in an etcher.

FIG. 2 illustrates a top view of electrostatic chuck (ESC, also referred to as E-Chuck) 16 and lift pins 14. Wafer 10 (FIG. 1) may be placed over ESC 16 in the etching process. Three lift pins 14 are inside holes 17 in ESC 16, wherein lift pins 14 are used to lift up wafer 10 after the via-etching process is finished. Experiments performed by the inventors of the present invention have revealed that the corners 12 prone to the JTAG failures are directly overlying lift pins 14. The JTAG failures occur to the gate dielectrics and the overlying polysilicon gate electrodes (not shown) of the chips directly over lift pins 14. On the transmission electron microscopy (TEM) images, it was found that polysilicon gates are damaged in the failed chips. However, in other chips not directly over lift pins 14, the JTAG failure rate is significantly lower. One possible explanation of such a phenomenon is that during the plasma etching for forming via openings, antenna effect occurs and charges are accumulated to the conductive paths, including the metal exposed through the via opening, the polysilicon gate, and the metals therebetween. When lift pins 14 lift wafer 10 up, since lift pins 14 are grounded, the accumulated charges are discharged to the electrical ground. Since the chips directly overlying the lift pins have small discharging resistances to the ground, the discharging currents are relatively high, and hence the polysilicon and/or the underlying gate dielectrics are damaged, resulting in the JTAG failure. On the other hand, the chips not directly over lift pins 14, at the time lift pins 14 contact wafer 10, have relatively high discharging resistances and hence the discharging currents are relatively low resulting in a smaller JTAG failure rate.

Figure 3:
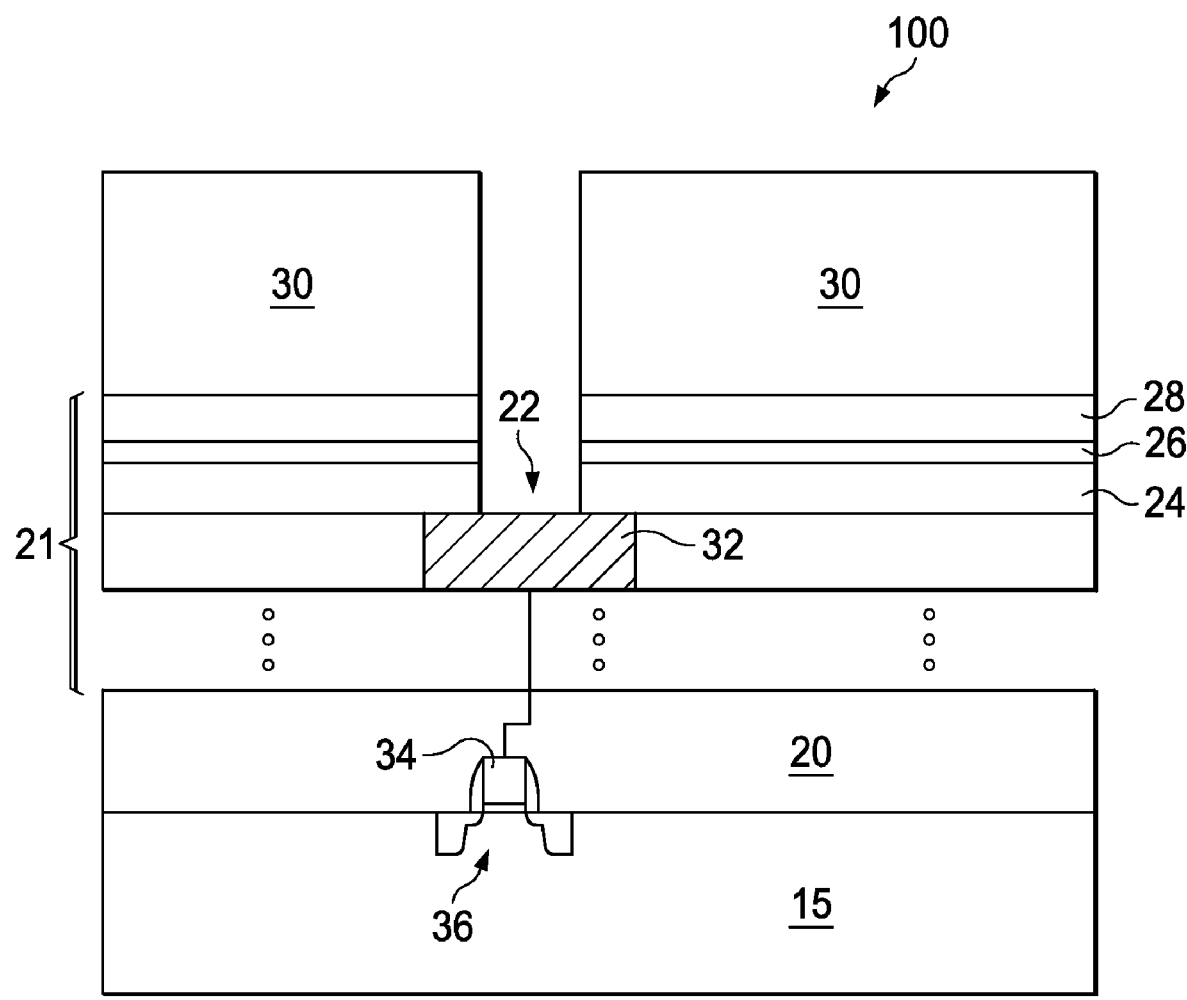
FIG. 3 illustrates a cross-sectional view of an exemplary wafer, on which a via-etching process is performed.

Based on the above-findings, a novel via-etching process is presented. Throughout the various views and illustrative embodiments of the present invention, like reference numbers are used to designate like elements. Throughout the description, an exemplary structure as shown in FIG. 3 is used to explain the concept of the embodiments of the present invention. One skilled in the art will realize, however, that the teaching provided by the embodiments may be applied to the formation of other integrated circuit components.

FIG. 3 illustrates a cross-sectional view of wafer 100, which includes a plurality of chips. Over semiconductor substrate 15, inter-layer dielectric (ILD) 20 and dielectric layers 21 are formed. Dielectric layers 21 may include dielectric layer 24, etch stop layer 26, and dielectric layer 28. Dielectric layers 24 and 28 may be low-k dielectric layers comprising low-k dielectric materials, for example, with k values less than about 2.5. Throughout the description, dielectric layer 24 is referred to as a via inter-metal dielectric (IMD), while dielectric layer 28 is referred to as a trench IMD. In an embodiment, the via-etching of the embodiments of the present invention is for forming via opening 22, through which underlying conductive feature 32 is exposed. Conductive feature 32 is electrically coupled to gate electrode 34 of transistor 36 through metal lines and vias (not shown, symbolized using a line). Since conductive feature 32 is exposed as a result of the via-etching, antenna effect may occur and the charges produced in the plasma etching may be accumulated to conductive feature 32 and gate electrode 34.

Figure 4:
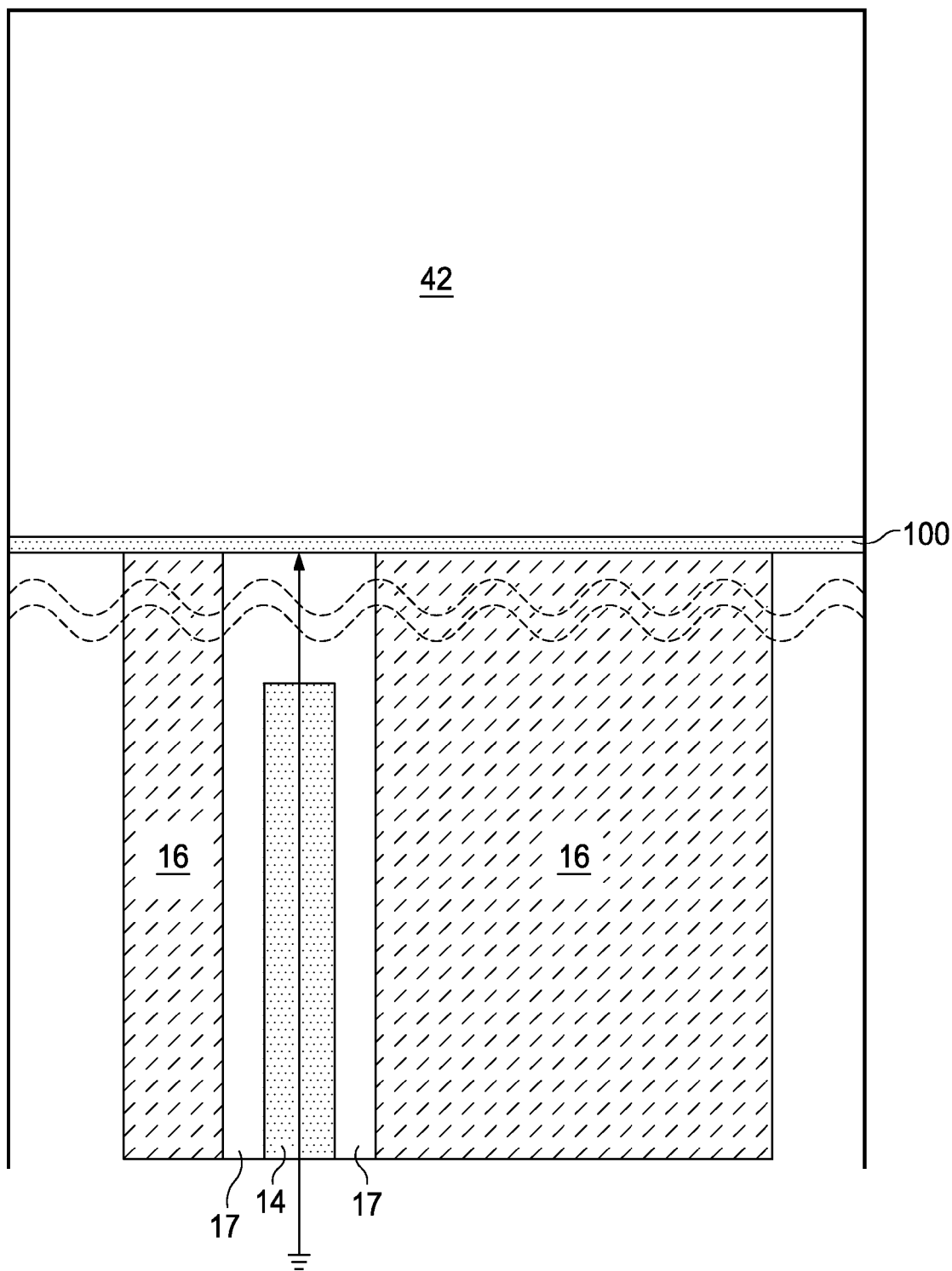
FIG. 4 illustrates a cross-sectional view of an etcher.

FIG. 4 illustrates etcher 40 for performing an embodiment of the present invention. Etcher 40 includes chamber 42 that can be vacuumed in the etching process. During the etching process, process gases are introduced into chamber 42. Plasma may be generated out of the process gases by applying energy to ionize the process gases. ESC 16 is located in chamber 42. Holes 17 are made penetrating ESC 16, in which lift pins 14 are located, with each of lift pins 14 in one of holes 17. FIG. 2 is a top view of ESC 16 and a lift pins 14, wherein the cross-sectional view of ESC 16 as shown in FIG. 4 is made in a plane crossing line A-A' in FIG. 2. Lift pins 14 may moved up and down in holes 17. ESC 16 may be applied with a positive voltage to hold wafer 100 thereon, or a negative voltage to release wafer 100, so that wafer 100 may be lifted up from ESC 16 by lift pins 14.

In an embodiment, wafer 100 as in FIG. 4 includes a structure as shown in FIG. 3. Referring to FIG. 3, before via opening 22 is formed, photo resist 30 is formed over trench IMD 28, and is developed so that the pattern of via opening 22 is defined. Referring back to FIG. 4, wafer 100 is then placed into chamber 42. A positive voltage, for example, about 700V, is applied to ESC 16 so that a static force is generated to attract wafer 100 onto ESC 16. An etching process may then be performed to etch trench IMD 28, etch stop layer 26, and via IMD 24 until conductive feature 32 (FIG. 3), for example, a metal line or a metal pad, is exposed. The etching includes plasma (dry) etching so that the process gases in chamber 42 are ionized. Accordingly, conductive feature 32 is in contact with the plasma. Next, photo resist 30 is ashed, for example, using an oxygen-containing process gas. During the via-etching step and the subsequent ashing of photo resist 30, helium is introduced to the backside of wafer 100 for a heat-dissipating purpose.

The ashing process results in the removal of photo resist 30. A de-chuck process is then started to release (neutralize) the charges in wafer 100, so that the holding force that holds wafer 100 on ESC 16 is at least reduced, or even substantially eliminated.

As part of the de-chuck process, an argon de-chuck is performed, wherein argon is introduced into chamber 42 and a radio frequency (RF) power, for example, about 400 watts, is applied to ionize argon and generate argon plasma. The RF energy may be applied for about 10 seconds. It is expected that by applying the argon plasma, the accumulated charges built up in wafer 100 are at least partially neutralized. The argon de-chuck is part of the de-chuck process because it also has the effect of releasing wafer 100.

During or after the period when the argon plasma is in chamber 42, a reverse de-chuck voltage is applied to ESC 16 to de-chuck (release) wafer 100. In an embodiment, the reverse de-chuck voltage (referred to as a high reverse de-chuck voltage hereinafter) is between about −650V and about −975V. Experiments have found that, advantageously, by limiting the reverse de-chuck voltage in this range, the JTAG failure that may occur to wafer 100 in the via-etching is significantly reduced. This range of the reverse de-chuck voltage is likely to be less negative than the low reverse de-chuck voltages that are also used for de-chuck, which low reverse de-chuck voltages may be about −1300V, for example. The reverse de-chuck voltage may be applied, for example, about 2 seconds, although a longer or shorter time may also be used.

After the de-chuck process, lift pins 14 are raised to lift up wafer 100. Lift pins 14 are grounded and contact the backside of wafer 100. Accordingly, charges that are accumulated in the exposed conductive features may be discharged through the backside of wafer 100. Advantageously, due to the use of the high reverse de-chuck voltage, which has a magnitude of about 50 percent to about 75 percent of the low reverse de-chuck voltage, the JTAG failure is significantly reduced. Experiments performed on wafers have demonstrated that if a low reverse de-chuck voltage of −1300V (which was used in conventional via-etching processes) is used, after the formation of opening 22 (FIG. 3) and the subsequent photo resist ashing, the voltage potentials on the respective wafers range between about 6.5V and about −0.1V, with the difference being about 6.6V. As a comparison, when a high reverse de-chuck voltage of −975V (an embodiment of the present invention) is used, after the etching and ashing process of opening 22, the voltage potentials on the respective wafers range between about −1.3V and about −3.9V, with the difference being only about 2.6V. The significant reduction in the differences of voltage potentials on a same wafer indicates better charge neutralization in the embodiments of the present invention than in conventional methods, which results in lower JTAG failure rates.

Figure 5:
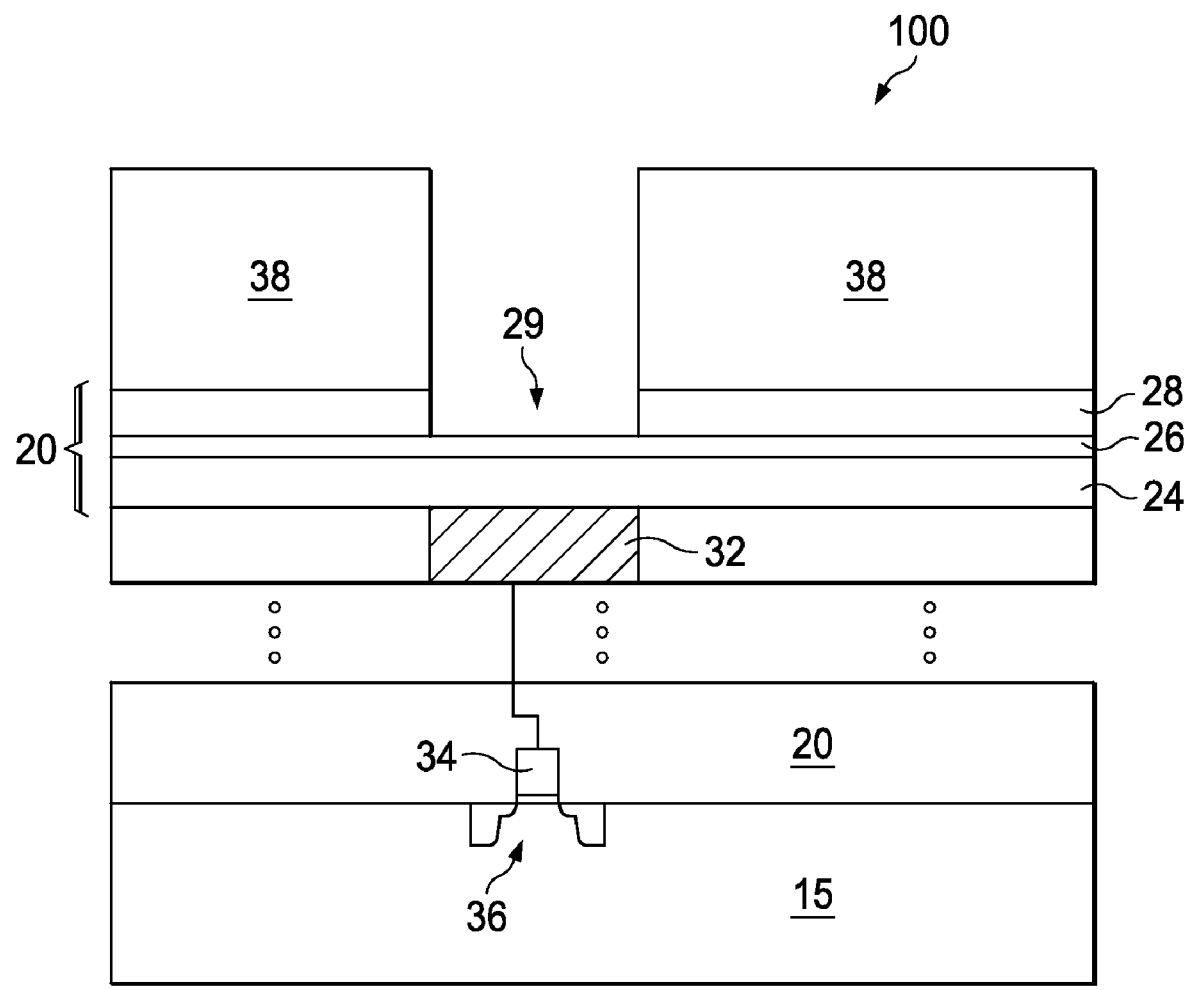
FIG. 5 illustrates a cross-sectional view of an exemplary wafer on which a trench-etching process is performed.

Referring back to FIG. 5, the formation of integrated circuits also includes the formation of trench openings, in which metals are filled to form metal lines and metal pads. As is known in the art, trench opening 29 may be formed before the formation of via opening 22 (which is referred to as a via-last approach), or after the formation of via opening 22 (which is referred to as a via-first approach). Wafer 100 thus needs to go through a similar process as the above-discussed via-etching process to form trench opening 29. In an embodiment of the present invention, trench opening 29 of wafer 100 is formed using a same etcher as, or a different etcher from, the etcher for forming via opening 22. The process for the etching is known in the art, and hence is not described in detail herein. After the etching of trench IMD 28 and the ashing of photo resist 38, wafer 100 is released from ESC 16. The de-chuck process is similar to the de-chuck process for via-etching, except the low reverse de-chuck voltage, which may be, for example, −1300V, instead of the high reverse de-chuck voltage, is used. In alternative embodiments, in trench etching, the low reverse de-chuck voltage may also be used.

The transition between the high reverse de-chuck voltage to the low reverse de-chuck voltage may not be performed using an automatic recipe. The etcher may have to be shut down, and the respective production line may have to be halted for changing the reverse de-chuck voltage setting. However, such a transition is necessary. As discussed in the preceding paragraphs, for via-etching, experiments have shown that the low reverse de-chuck voltage can effectively reduce the JTAG failure in the manufacturing processes of via openings of certain integrated circuit products. However, for other components (for example, trench opening 29) other than the via opening on wafer 100, or for other production wafers having different integrated circuit design, such failure may not pose a problem. Accordingly, for the trench-etching process for forming trench opening 29 on wafer 100, or for the via-etching process for other wafers having different integrated circuit design, the low reverse de-chuck voltage may be used. Hence, both the low reverse de-chuck voltage and the high reverse de-chuck voltage may be used, for example, for the etchings of different features in a same wafer, or for similar features on different wafers, even though the co-existence of the high and low reverse de-chuck voltages involves turning off the etcher(s). The reason why the low reverse de-chuck voltage is also needed is that the low reverse de-chuck voltage was used for long time and was well-tested and existing etching recipes were tuned to the low reverse de-chuck voltage. Therefore, continuing to use the low reverse de-chuck voltage may avoid unexpected problems that arise due to the mismatch between the high reverse de-chuck voltage and other parameters of the etching recipes. Further, the trench-etching process as discussed may be performed using a same etcher as for forming via opening 22 of the same wafer 100, or a different etcher having a similar design (or even of an exactly same type).

On the other hand, via-etching is a common process for forming integrated circuits. Therefore, the same etcher that is used to form opening 22 of wafer 100 may also be used to form openings of other wafers, which, although also have via openings, will have a different design of the integrated circuits. In this case, when a wafer that is prone to the JTAG failure problem is undergoing a via-etching process, the high reverse de-chuck voltage is used in the corresponding de-chuck process to reduce the JTAG failure, even if the transition between the low reverse de-chuck voltage and the high reverse de-chuck voltage means turning off the etcher. On the other hand, another wafer having a different design may not be prone to the JTAG failure, and hence the low reverse de-chuck voltages may be used. Please note that different reverse de-chuck voltages may be used to two wafers having different designs even if the via openings in these two wafers are on a same metal level, for example, both being in metal layer 2 (commonly known as M2).

The embodiments of the present invention have several advantageous features. By adjusting the reverse de-chuck voltage in the de-chuck steps in the via-etching processes, the JTAG failure rate has been significantly reduced. Experiments have revealed that if the low reverse de-chuck voltage of −1300V is used, the JTAG failure rate may be as high as about 12 percent to about 18 percent, with the average being about 5.6 percent. However, by reducing the reverse de-chuck voltage by between about 25 percent (for example, to about −975V) and about 50 percent (for example, to about −650V), the JTAG failure of chips directly over the lift pins is substantially eliminated. As a result, the JTAG failure rate of all chips on wafers is reduced to less than about 1.5 percent on average.

Although the present invention and its advantages have been described in detail, it should be understood that various changes, substitutions, and alterations can be made herein without departing from the spirit and scope of the invention as defined by the appended claims. Moreover, the scope of the present application is not intended to be limited to the particular embodiments of the process, machine, manufacture, and composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming an integrated circuit structure on a wafer, the method comprising:
   providing a first etcher comprising a first electrostatic chuck (ESC);
   placing the wafer on the first ESC;
   forming a via opening in the wafer using the first etcher;
   after the step of forming the via opening, applying a first reverse de-chuck voltage to the first ESC to release the wafer;
   placing the wafer on a second ESC of a second etcher;
   performing an etching step to form an additional opening in the wafer using the second etcher; and
   after the step of forming the additional opening, applying a second reverse de-chuck voltage to the second ESC to release the wafer, wherein the first reverse de-chuck voltage has a magnitude between about 50 percent and about 75 percent of a magnitude of the second reverse de-chuck voltage.

2. The method of claim 1, wherein the first etcher and the second etcher are a same etcher.

3. The method of claim 1 further comprising, after the step of applying the first reverse de-chuck voltage to the first ESC:
   turning off the first etcher;
   adjusting a reverse de-chuck voltage setting of the first etcher from the first reverse de-chuck voltage to the second reverse de-chuck voltage;
   turning on the first etcher;
   forming an additional via opening for an additional wafer using the first etcher; and
   after the step of forming the additional via opening, applying the second reverse de-chuck voltage to the first ESC to release the additional wafer.

4. The method of claim 1, wherein after the step of forming the via opening, a conductive feature is exposed through the via opening, and wherein the additional opening is a trench opening.

5. A method of forming an integrated circuit structure, the method comprising:
- providing an etcher comprising an electrostatic chuck (ESC);
- placing a first wafer on the ESC;
- forming a first via opening in the first wafer using the etcher;
- after the step of forming the first via opening, applying a first reverse de-chuck voltage to the ESC to release the first wafer;
- placing a second wafer on the ESC;
- forming a second via opening in the second wafer using the etcher; and
- after the step of forming the second via opening, applying a second reverse de-chuck voltage to the ESC to release the second wafer, wherein the second reverse de-chuck voltage has a magnitude between about 50 percent and about 75 percent of a magnitude of the first reverse de-chuck voltage.

6. The method of claim 5, wherein the second wafer has a different integrated circuit design from the first wafer.

7. The method of claim 5, wherein the first via opening and the second via opening are at a same metal level of the first wafer and the second wafer, respectively.

8. The method of claim 5 further comprising, between the step of applying the first reverse de-chuck voltage to the ESC and the step of placing the second wafer on the ESC:
- turning off the etcher;
- adjusting a reverse de-chuck voltage setting of the etcher from the first reverse de-chuck voltage to the second reverse de-chuck voltage; and
- turning on the etcher.

9. The method of claim 5, wherein after the step of forming the first via opening and the step of forming the second via opening, a first conductive feature and a second conductive feature are exposed through the first via opening and the second via opening, respectively.

10. A method of forming an integrated circuit structure on a wafer, the method comprising:
- providing an etcher comprising an electrostatic chuck (ESC);
- placing the wafer on the ESC, wherein the wafer comprises:
  - a conductive feature; and
  - a dielectric layer over the conductive feature;
- etching the dielectric layer to form a via opening in the wafer using the etcher until the conductive feature is exposed through the via opening;
- after the step of forming the via opening, applying a first reverse de-chuck voltage to the ESC to release the wafer, wherein the first reverse de-chuck voltage is between about −650V and about −975V;
- etching an upper layer over the dielectric layer to form a trench opening; and
- after the step of forming the trench opening, applying a second reverse de-chuck voltage to the ESC to release the wafer, wherein the second reverse de-chuck voltage is lower than the first reverse de-chuck voltage.

11. The method of claim 10 further comprising:
- before the step of placing the wafer on the ESC, adjusting a reverse de-chuck voltage setting of the etcher from a second reverse de-chuck voltage different from the first reverse de-chuck voltage to the first reverse de-chuck voltage.

12. The method of claim 11 further comprising turning off the etcher before the step of adjusting the reverse de-chuck voltage setting, and turning on the etcher after the step of adjusting the reverse de-chuck voltage setting.

13. The method of claim 11 further comprising:
- after the step of applying the first reverse de-chuck voltage to the ESC to release the wafer, turning off the etcher, and adjusting a reverse de-chuck voltage setting of the etcher from the first reverse de-chuck voltage to the second reverse de-chuck voltage.

14. The method of claim 11, wherein a magnitude of the first reverse de-chuck voltage is lower than a magnitude of the second reverse de-chuck voltage by between about 25 percent to about 50 percent.

* * * * *